US012805215B2

(12) United States Patent
Li

(10) Patent No.: US 12,805,215 B2
(45) Date of Patent: Nov. 17, 2026

(54) SEMICONDUCTOR STRUCTURE AND METHOD OF MANUFACTURING THE SAME

(71) Applicant: UNITED MICROELECTRONICS CORP., Hsin-Chu City (TW)

(72) Inventor: Shin-Hung Li, Nantou County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 330 days.

(21) Appl. No.: 18/755,651

(22) Filed: Jun. 26, 2024

(65) Prior Publication Data

US 2024/0347338 A1 Oct. 17, 2024

Related U.S. Application Data

(62) Division of application No. 17/556,972, filed on Dec. 20, 2021, now Pat. No. 12,057,313.

(30) Foreign Application Priority Data

Nov. 19, 2021 (CN) ........................ 202111375792.7

(51) Int. Cl.
*H10P 14/20* (2026.01)
*H10D 30/67* (2025.01)
(Continued)

(52) U.S. Cl.
CPC ..... *H10P 14/3434* (2026.01); *H10D 30/6755* (2025.01); *H10D 84/08* (2025.01); *H10D 99/00* (2025.01)

(58) Field of Classification Search
CPC H10P 14/3434; H10D 99/00; H10D 30/6755; H10D 84/08
See application file for complete search history.

(56) References Cited

U.S. PATENT DOCUMENTS 6,872,978 B2 3/2005 Zhang
9,419,015 B1 8/2016 Wu
(Continued)

FOREIGN PATENT DOCUMENTS

CN 109427781 A 3/2019
JP 2000-196096 A 7/2000
(Continued)

OTHER PUBLICATIONS

Rahaman ,Effect of Doping Fluorine in Offset Region on Performance of Coplanar a-IGZO TFTs ,Jul. 2018.

*Primary Examiner* — Richard A Booth
(74) *Attorney, Agent, or Firm* — Winston Hsu

(57) ABSTRACT

The present invention provides a semiconductor structure, including a substrate, a thin-film transistor (TFT) on the substrate, wherein the thin-film transistor including a TFT channel layer, a first source and a first drain in the TFT channel layer and a first capping layer on the TFT channel layer. A MOSFET is on the substrate, with a second gate, a second source and a second drain on two sides of the second gate and a second capping layer on the second gate, wherein top surfaces of the second capping layer and the first capping layer are leveled, and a first ILD layer is on the first capping layer and the second capping layer, wherein the first ILD layer and the first capping layer function collectively as a gate dielectric layer for the TFT.

5 Claims, 7 Drawing Sheets

(51) Int. Cl.
*H10D 84/08* (2025.01)
*H10D 99/00* (2025.01)

(56) References Cited

U.S. PATENT DOCUMENTS

| | | | | |
|---|---|---|---|---|
| 2006/0001091 | A1* | 1/2006 | Kim | H10D 62/83 438/149 |
| 2008/0017859 | A1* | 1/2008 | Tai | H10D 86/00 257/E27.111 |
| 2009/0278120 | A1* | 11/2009 | Lee | H10D 30/6739 257/E29.296 |
| 2010/0032675 | A1 | 2/2010 | Enichlmair | |
| 2016/0380231 | A1 | 12/2016 | Yim | |
| 2017/0242300 | A1 | 8/2017 | Lim | |
| 2022/0069021 | A1 | 3/2022 | Kim | |

FOREIGN PATENT DOCUMENTS

| | | | |
|---|---|---|---|
| KR | 1999-004572 | A | 1/1999 |
| KR | 10-2006-0078429 | A | 7/2006 |

* cited by examiner

SEMICONDUCTOR STRUCTURE AND METHOD OF MANUFACTURING THE SAME

CROSS REFERENCE TO RELATED APPLICATIONS

This application is a division of U.S. application Ser. No. 17/556,972, filed on Dec. 20, 2021. The content of the application is incorporated herein by reference.

BACKGROUND OF THE INVENTION

1. Field of the Invention

The present invention relates generally to a semiconductor structure and method of manufacturing the same, and more specifically, to a semiconductor structure integrated with CMOS process and method of manufacturing the same.

2. Description of the Prior Art

With rapid and continuous progress of thin-film transistors (TFTs) technology in past few years, TFT display panel is adopted in the applications other than in traditional computer monitor, for example, in the application like novel flexible electronic product, biomedical sensor, non-volatile memory or 3D IC. In addition, since the prosperous growth in the industries like automotive electronics, wireless communication devices and data processing, using TFT as a power IC in these novel applications is currently a focus of attention in the market. Demand for these high power, high frequency and high speed transistor devices keeps growing. In this context, how to integrate TFT devices into traditional CMOS logic process becomes an urgent topic for those of skilled in the art to research and develop, in order to simplify overall process and reduce cost.

SUMMARY OF THE INVENTION

In the light of aforementioned market demand, the present invention hereby provides a novel semiconductor structure and method of manufacturing the same, with features of integrating the manufacture of high-voltage TFT devices into front-end-of-line (FEOL) of CMOS logic process to significantly reduce overall process steps and manufacturing cost. In addition, active areas for the high-voltage TFT devices are defined before the formation of wells of CMOS logic devices, thus the thermal budget of overall process can be well controlled.

One aspect of the present invention is to provide a semiconductor structure, with components including a substrate, a thin-film transistor (TFT) on the substrate with a TFT channel layer, a first source and a first drain in the TFT channel layer, and a first capping layer the channel on TFT layer, and a metal-oxide-semiconductor field-effect transistor (MOSFET) on the substrate, wherein the MOSFET includes a second gate, a second source and a second drain respectively at two sides of the second gate, and a second capping layer on the second gate, and top surfaces of the second capping layer and the first capping are leveled, and a first interlayer dielectric (ILD) layer on the first capping layer and the second capping layer, wherein the first ILD layer and the first capping layer function collectively as a gate dielectric layer for the TFT.

Another aspect of the present invention is to provide a semiconductor process, with steps including forming a TFT channel layer on a substrate, manufacturing a MOSFET on the substrate after the TFT channel layer is formed and the MOSFET comprises a first gate, a first source and a first drain. After the MOSFET is manufactured, forming a second source and a second drain on the TFT channel layer, forming a first ILD layer on the TFT channel layer and the MOSFET after the second source and the second drain are formed, and forming a second gate on the first ILD layer, and the second gate, the TFT channel layer, the second source and the second drain constitute a TFT.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
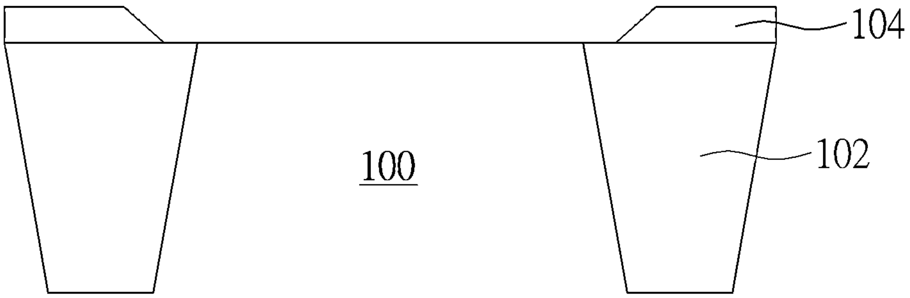
FIGS. 1-8 are cross-sections of a process flow of manufacturing a semiconductor structure in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
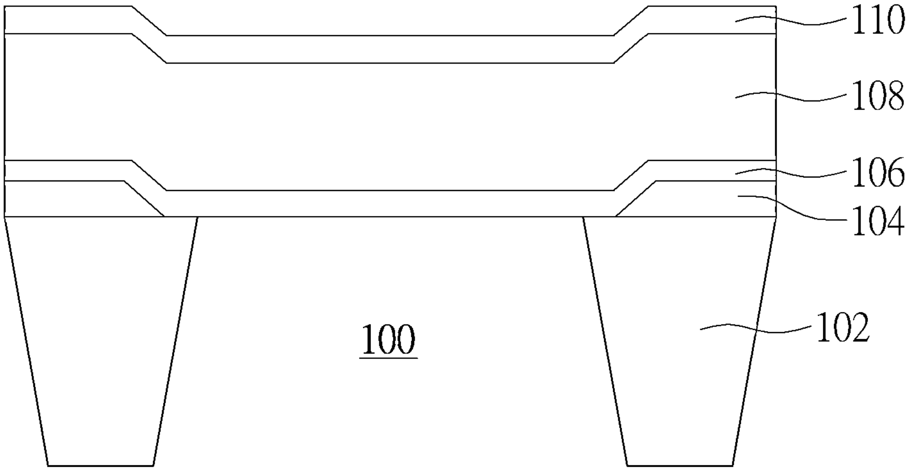
Figure 3:
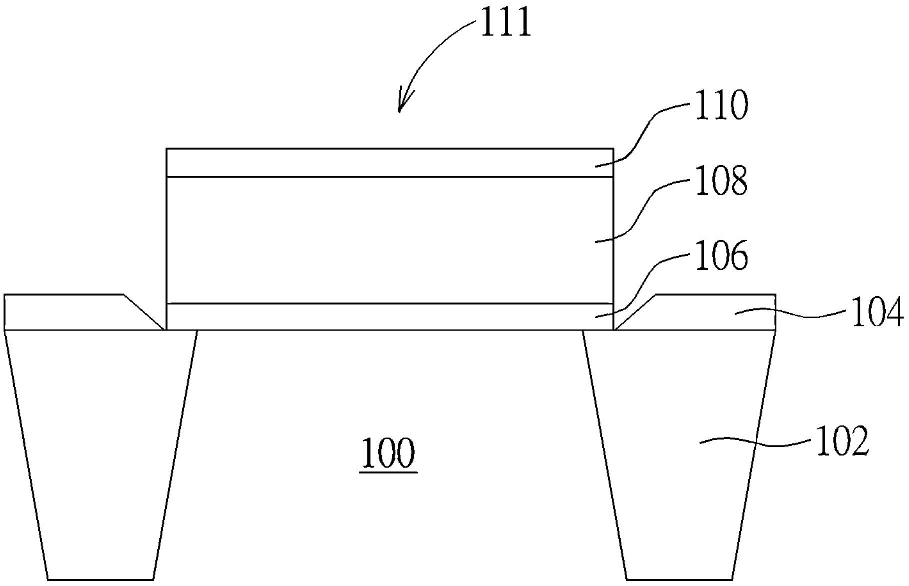

Please refer now to FIGS. 1-8, which are cross-sections of a process flow of manufacturing a semiconductor structure in accordance with the preferred embodiment of the present invention. In the preferred embodiment of present invention, the semiconductor structure of present invention includes a thin-film transistor (TFT) using indium gallium zinc oxide (IGZO) material as a channel layer, with features of integrating the TFT device into front-end-of-line (FEOL) of CMOS logic process and manufacturing the TFT devices together with the CMOS transistor device (logic device like PMOS or NMOS), in order to significantly reduce overall process steps and manufacturing cost. Please note that, for the conciseness and clearness of specification, FIGS. 1-3 illustrate only the section of TFT in the semiconductor structure, while FIGS. 4-8 illustrate both the sections of TFT and MOSFET in the semiconductor structure.

As shown in FIG. 1, provide a substrate 100 as a base for entire semiconductor structure. In the embodiment of present invention, since the purpose is to integrate with CMOS process, the substrate 100 is preferably selected from silicon-based substrate, such as a mono-crystalline silicon substrate, or a silicon-containing substrate like SiGe substrate, or a silicon-on-insulator (SOI) substrate, but not limited thereto. Silicon-oxide-based shallow trench isolations (STI) 102 may be formed on the substrate 100 to define active areas for transistor devices to be formed thereon. After the active areas are defined, an ion implantation process may be further performed to form deep n-wells (DNW, not shown) in the substrate 100 to isolate every active area in the MOSTFET region. A patterned hard mask layer 104 is formed on the substrate 100. In the embodiment of present invention, the material of hard mask layer 104 may be silicon nitride, which may be patterned through a photolithography process. The function of hard mask layer 104 is to define the areas where epitaxy to be grown thereon in the TFT region. Since epitaxy is not to be formed on the MOSFET region, the MOSFET region will be completely covered by the hard mask layer 104. The hard mask layer 104 generally exposes the active areas in the TFT region.

Please refer to FIG. 2. After the hard mask layer 104 is formed, a buffer layer 106, a TFT channel layer 108 and a capping layer 110 are sequentially formed on the substrate 100 and the hard mask layer 104. The function of buffer layer 106 is namely to serve as a buffer layer for the epitaxial growth on the substrate 100 and the TFT channel layer 108. In the preferred embodiment of present invention, the material of TFT channel layer 108 is preferably IGZO, while the material of buffer layer 106 may be selected from zinc oxide (ZnO), which may be formed on entire substrate 100 and hard mask layer 104 by sputtering. ZnO-based buffer layer 106 may function as a seed layer for IGZO epitaxial growth and as a gradual buffer layer between the IGZO epitaxy and the Si-based substrate 100, to facilitate the crystalline growth of TFT layer 108, channel control its crystallographic direction and reduce defects like lattice mismatch.

Refer still to FIG. 2. After the buffer layer 106 is formed, an epitaxy process is performed to form a TFT channel layer 108 on the buffer layer 106. In the preferred embodiment of present invention, the material of TFT channel layer 108 may be IGZO, especially amorphous IGZO (α-IGZO) with advantages like high electron mobility, good uniformity, and low manufacturing cost, which is highly suitable as a material for the high-voltage TFT device. IGZO-based TFT channel 108 may be formed by using molecular beam epitaxy (MBE) or reactive solid phase epitaxy (SPE). In other embodiment, the material of TFT channel layer 108 may be III-V compound material like silicon-germanium (SiGe) and may be formed by RF sputtering. After the TFT channel layer 108 is formed, a capping layer 110 is then formed on the TFT channel layer 108. In the preferred embodiment of present invention, the material of capping layer 110 is silicon oxide. In addition to the function of protecting underlying TFT channel layer 108, this layer may serve as a gate dielectric layer between the TFT channel layer 108 and a top gate (not formed yet). Since the manufacture of doped areas of CMOS region is not yet begun in this stage, an annealing treatment may be performed after the capping layer 110 is formed to improve the interface state between the silicon-oxide-based capping layer 110 and the IGZO-based TFT channel layer 108, thereby improving the stability and performance of the devices. This manufacturing sequence may provide better control for the thermal budget of overall process.

Please refer to FIG. 3. After the buffer layer 106, the TFT channel layer 108 and the capping layer 110 are formed, a photolithography process is then performed to pattern those layer structures, so as to form individual TFT bodies 111. In this step, the buffer layer 106, the TFT channel layer 108 and the capping layer 110 above the hard mask layer 104 (including entire CMOS region) are all removed to prevent these layers from affecting the manufacture of following components. At this time, the TFT channel layer 108 in the TFT body 111 is its active area, while other components like gate, source and drain will be manufactured in later processes.

Figure 4:
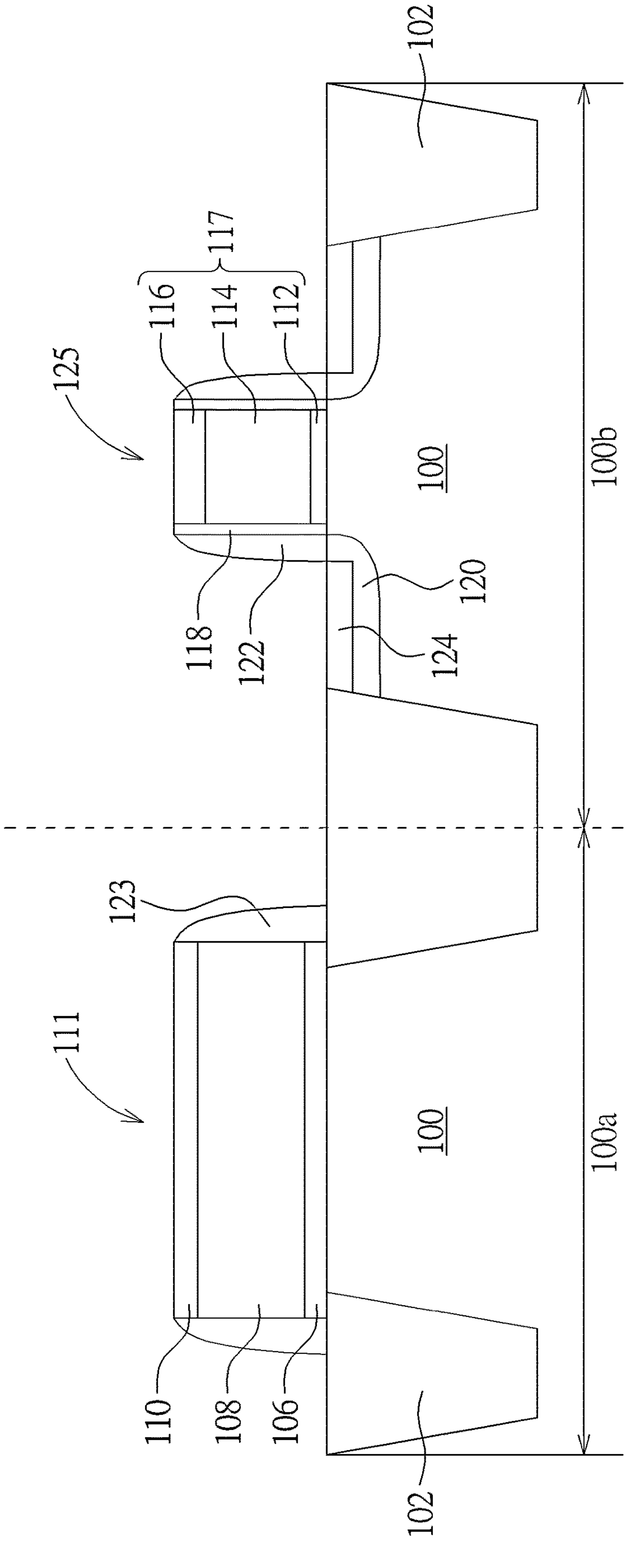

Please refer to FIG. 4. The following process will include the manufacture of transistors in the CMOS logic region. As shown in FIG. 4, the left part of the figure illustrates a TFT region 100*a* and the right part of the figure illustrates a CMOS region 100*b*. After the TFT is patterned, following steps are then performed to manufacture the MOSFET device on the CMOS region 100*b*: (1) removing remaining hard mask layer 104 to expose the active areas on the CMOS region 100*b*; (2) performing an ion implantation process to form corresponding wells, such as PMOS in n-well or NMOS in p-well (not shown), in the active areas of the CMOS region 100*b*; (3) sequentially forming a silicon-oxide based gate dielectric layer 112, a polysilicon layer 114 and a silicon-nitride based capping layer 116 of a gate layer structure; (4) patterning those layer structures to define a gate 117 of the CMOS transistor device; (5) forming first spacers 118 and lightly-doped drains (LDD) 120 at two sides of the gate 117; and (6) forming second spacers 122 and source/drain 124 at two sides of the gate 117. The manufacture of CMOS transistor device 125 is, therefore, completed. Since the aforementioned CMOS process is conventional and not the key point of present invention, no more redundant details will be herein given for the simplicity of the specification. Please note that in the embodiment of present invention, the step of forming first spacers 118 or second spacers 122 may simultaneously form spacers 123 on sidewalls of defined TFT body, in order to protect the TFT structure. In addition, in the preferred embodiment of present invention, the top surface of capping layer 116 of the gate structure and the top surface of capping layer 110 of the TFT structure are leveled to facilitate the subsequent planarization process and process integration thereof.

Figure 5:
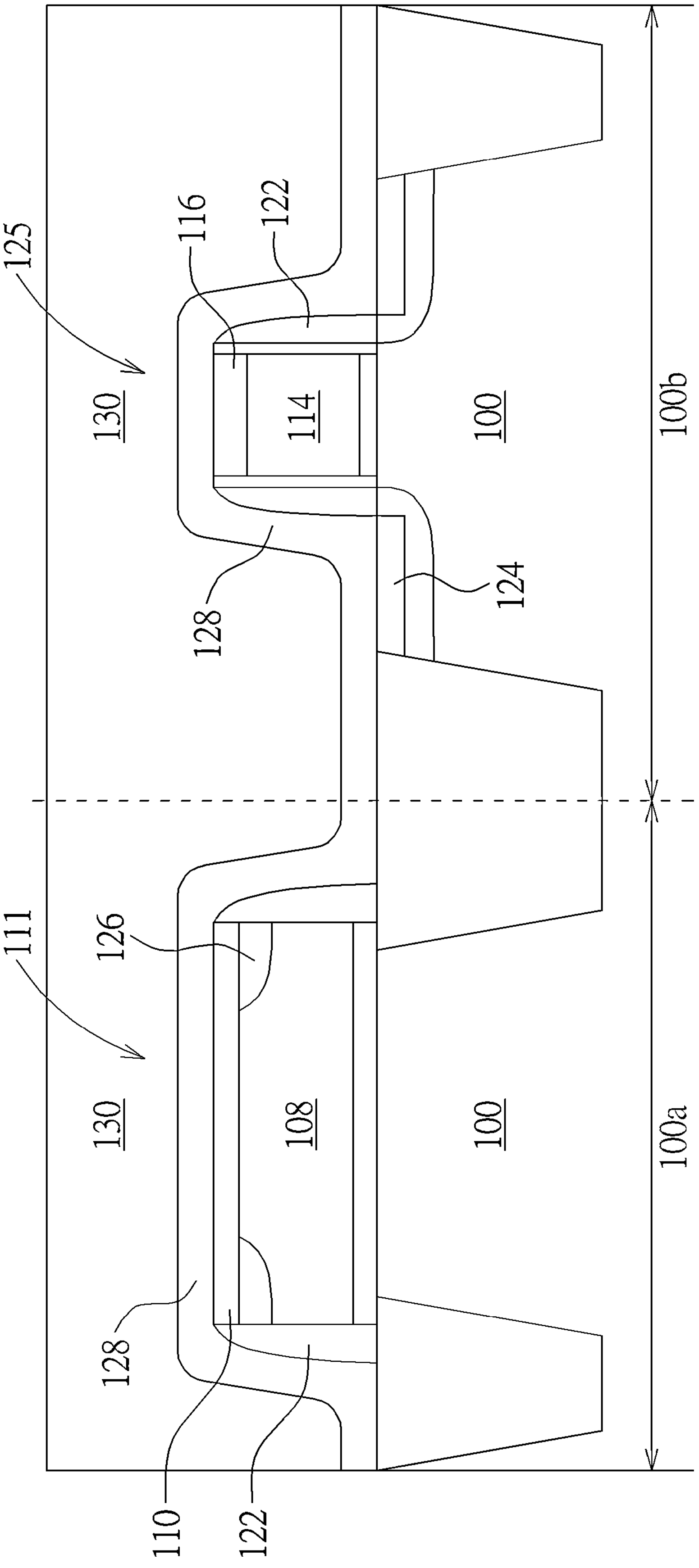

Please refer to FIG. 5. After the manufacture of CMOS transistor device is completed, source/drain 126 of the TFT is then formed on the TFT channel layer 108 in the TFT region 100*a*. In the embodiment of present invention, the TFT is designed in a self-aligned and coplanar manner. The source/drain 126 may be formed by forming heavily n-type doped (N+) areas on the surface of TFT channel layer 108 at two sides through the applying of a plasma treatment to the IGZO-based TFT channel layer 108 using F, He, Ar or H gas. This manufacturing method may reduce parasitic capacitance in the TFT device and maintain good interface state.

Refer still to FIG. 5. After source/drain 126 of the TFT are formed, a contact etch stop layer (CESL) 128 and an interlayer dielectric (ILD0) layer 130 are formed sequentially on the substrate 100. In the preferred embodiment of present invention, the CESL 128 is formed conformally on the TFT body 111 and the CMOS transistor device 125. The material of CESL 128 is silicon nitride, which may be formed by PECVD to exert stress on the gate. In addition, a metal silicide process may be performed before the formation of CESL 128 to form silicide (not shown) on the surfaces of Si-based gate, source and drain, in order to lower contact resistance. The ILD layer 130 covers on entire surface of the substrate and fills up the gaps and spaces between devices, with material like phosphor-silicate glass (PSG), boro-phospho-silicate glass (BPSG) or tetraethyl orthosilicate (TEOS), and which may be formed by using sub-atmospheric chemical vapor deposition (SACVD) or high density plasma chemical vapor deposition (HDPCVD) process.

Figure 6:
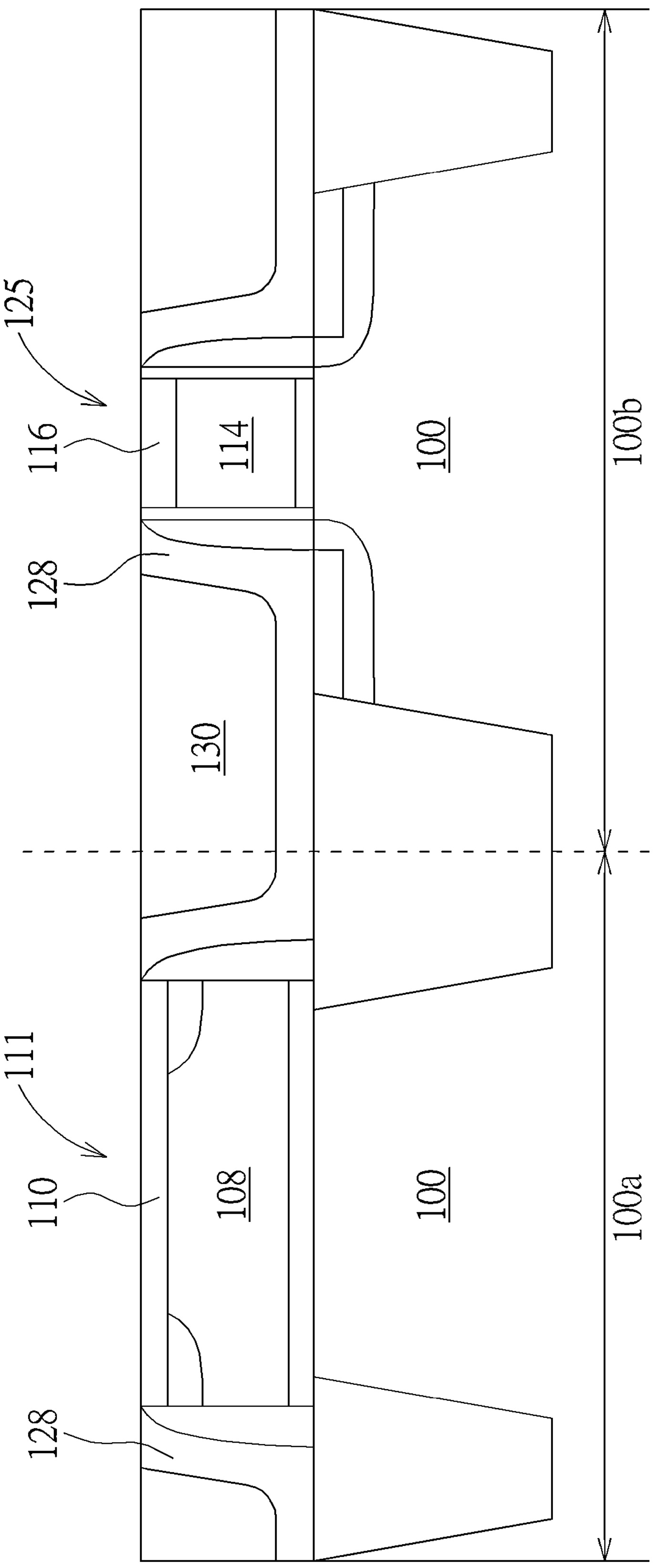

Please refer to FIG. 6. After the CESL 128 and the ILD layer 130 are formed, a chemical mechanical planarization (CMP) process is performed to remove CESL 128 and ILD layer 130 on the TFT body 111 and CMOS transistor device 130. This step would expose the capping layer 110 in TFT body 111 and the capping layer 116 in CMOS transistor device 125. In the preferred embodiment of present invention, the top surface of capping layer 110 in TFT body 111 and the top surface of capping layer 116 in CMOS transistor device 125 are designed to be in the same level, so that one CMP process may simultaneously expose the top surfaces of two structures.

Figure 7:
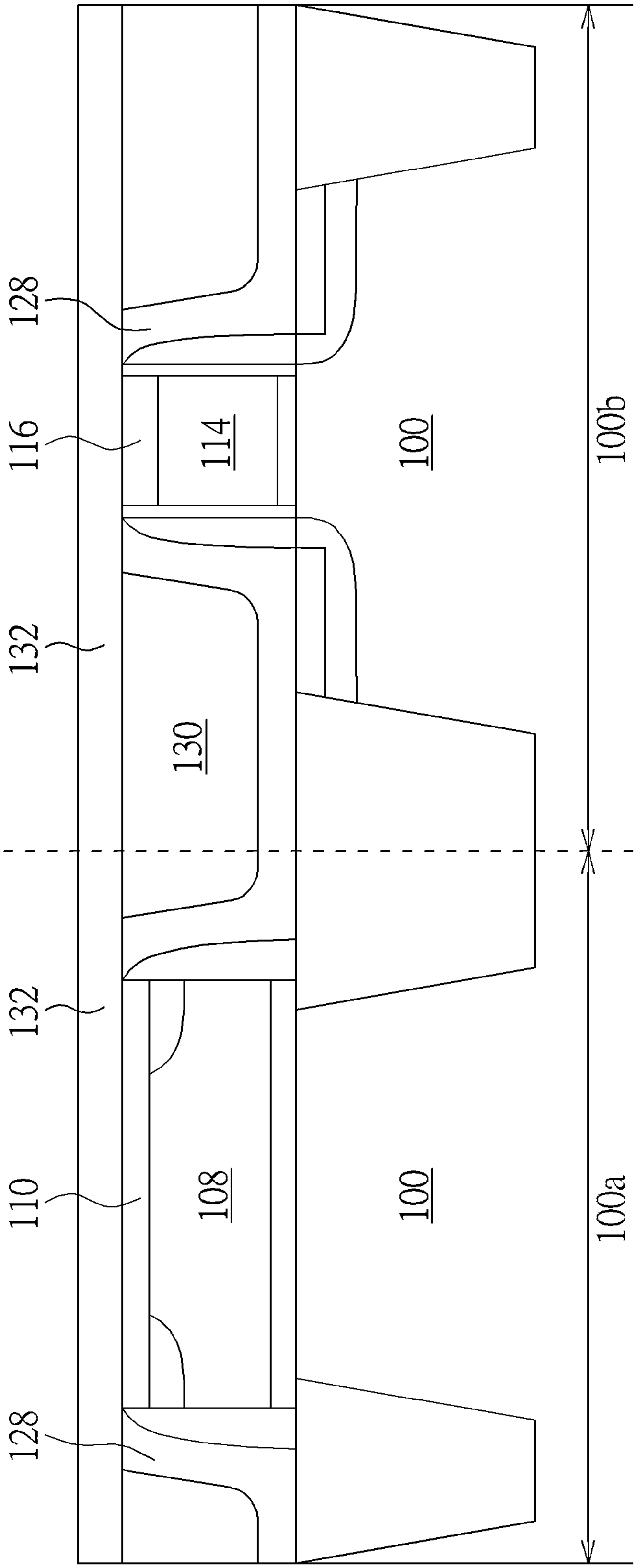

Please refer to FIG. 7. After the capping layer 110 in TFT body 111 and the capping layer 116 in CMOS transistor device 125 are exposed, another interlayer dielectric (ILD1) layer 132 is then formed on the substrate surface. In the preferred embodiment of present invention, the ILD layer 132 would cover on the exposed capping layer 110 of the TFT body 111 and the exposed capping layer 116 of the CMOS transistor device 125 as well. Furthermore, the ILD layer 132 in this embodiment and underlying capping layer 110 function collectively as a gate dielectric layer for the TFT device, with a material like silicon oxide and a thickness controlled in required range.

Figure 8:
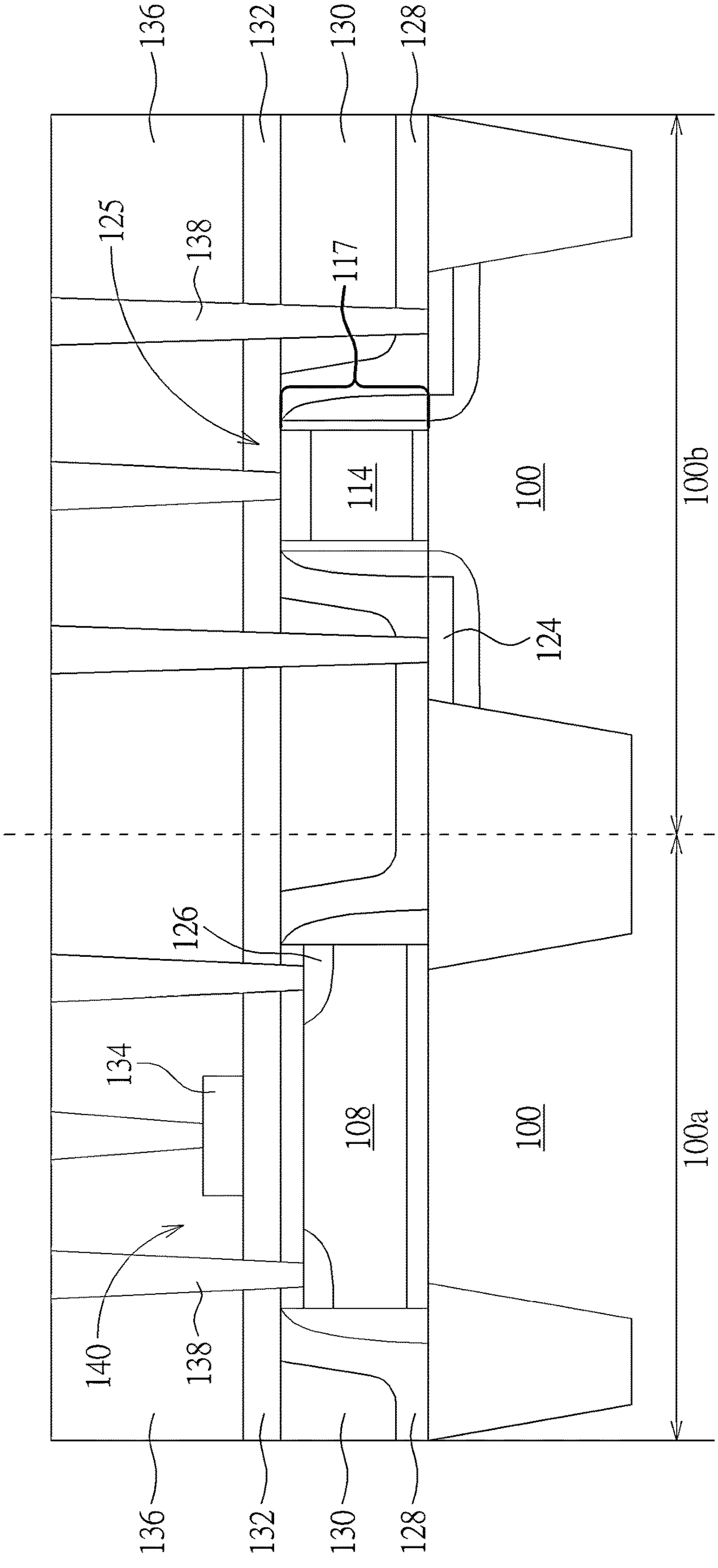

Please refer to FIG. 8. After the ILD layer 132 is formed, a top gate 134 is then formed on the ILD layer 132 above the TFT body 111, which positioned between source/drain 126 of the TFT. The material of top gate 134 may be metal, such as titanium (Ti) or titanium nitride (TiN). In this way, the top gate 134, the source/drain 126 and the TFT channel layer 108 constitute collectively a TFT device 140. After the top gate 134 is formed, another interlayer dielectric (ILD2) layer 136 is then covered on the top gate 134 and the ILD layer 132, and contacts 138 are formed thereafter extending through the ILD layer 132 and/or the ILD layer 136 to connect the top gate 134 and source/drain 126 of the TFT device 140 and the gate 117 and source/drain 124 of the CMOS transistor device 125. The material of contact 138 may be metal, such as tungsten (W), molybdenum (Mo) or copper (Cu). Thereafter, back-end-of-line (BEOL) of the CMOS process may be performed subsequently above the ILD layer 136 and the contacts 138. Since these processes are conventional skills and not the key point of the present invention, no redundant details will be herein given for the simplicity of the specification.

In conclusion to the aforementioned embodiments, the essential feature of present invention is to integrate the high-voltage TFT devices into front-end-of-line (FEOL) of CMOS logic process and manufacture the TFT devices together with the CMOS transistor devices, wherein the TFT active areas are defined before the manufacture of CMOS transistor devices, and source/drain of the TFT is designed in a self-aligned and coplanar manner and formed after the manufacture of CMOS transistor devices. This approach may achieve better control for the thermal budget of the processes. In addition, the top gate of TFT is formed in one of the ILD layers and said ILD layer is used as the gate dielectric layer, which may facilitate the integration of TFT devices with CMOS process.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A semiconductor process, comprising:

forming a TFT channel layer on a substrate;

manufacturing a MOSFET on said substrate after said TFT channel layer is formed, and said MOSFET comprises a first gate, a first source and a first drain;

after said MOSFET is manufactured, forming a second source and a second drain on said TFT channel layer;

forming a first ILD layer on said TFT channel layer and said MOSFET after said second source and said second drain are formed; and forming a second gate on said first ILD layer, and said second gate, said TFT channel layer, said second source and said second drain constitute a TFT.

2. The semiconductor process of claim 1, further comprising forming spacers simultaneously on sidewalls of said TFT channel layer and said first gate of said MOSFET.

3. The semiconductor process of claim 1, further comprising a first capping layer on said first gate of said MOSFET and a second capping layer on said TFT channel layer, and said semiconductor process further comprises:

forming a contact etch stop layer on said TFT channel layer and said MOSFET;

performing a chemical mechanical planarization (CMP) process to remove parts of said contact etch stop layer and to expose said first capping layer and said second capping layer; and forming a first ILD layer on said TFT channel layer and said MOSFET after said CMP process.

4. The semiconductor process of claim 1, further comprising:

forming a patterned hard mask layer on said substrate before said TFT channel layer is formed, and regions exposed from said patterned hard mask layer are epitaxial regions;

performing an epitaxial process to grow said TFT channel layer;

performing a photolithography process to pattern said TFT channel layer in order to define an active area for said TFT; and removing said hard mask layer.

5. The semiconductor process of claim 4, further comprising:

forming a second ILD layer on said first ILD layer after said second gate is formed; and forming contacts extending through said second ILD layer and said first ILD layer to connect said first gate, said first source, said first drain, said second gate, said second source and said second drain.

* * * * *